(12) United States Patent
Kuisma (10) Patent No.: US 9,442,032 B2
(45) Date of Patent: Sep. 13, 2016

(54) MICROELECTROMECHANICAL PRESSURE SENSOR WITH ROBUST DIAPHRAGM

(71) Applicant: MURATA MANUFACTURING CO., LTD., Nagaokakyo-shi, Kyoto (JP)

(72) Inventor: Heikki Kuisma, Helsinki (FI)

(73) Assignee: MURATA MANUFACTURING CO., LTD., Nagaokakyo-Shi, Kyoto (JP)

( * ) Notice: Subject to any disclaimer, the term of this patent is extended or adjusted under 35 U.S.C. 154(b) by 218 days.

(21) Appl. No.: 14/270,813

(22) Filed: May 6, 2014

(65) Prior Publication Data

US 2015/0226624 A1  Aug. 13, 2015

(30) Foreign Application Priority Data

May 10, 2013 (FI) ..................................... 20135487

(51) Int. Cl.
| | | |
|---|---|---|
| G01L 9/00 | (2006.01) | |
| G01L 7/08 | (2006.01) | |
| B81B 3/00 | (2006.01) | |

(52) U.S. Cl.
CPC ............. *G01L 9/0072* (2013.01); *B81B 3/007* (2013.01); *G01L 7/082* (2013.01); *G01L 9/0042* (2013.01); *G01L 9/0048* (2013.01); *G01L 9/0054* (2013.01); *G01L 9/0073* (2013.01); *B81B 2201/0264* (2013.01); *B81B 2203/0127* (2013.01)

(58) Field of Classification Search
None
See application file for complete search history.

(56) References Cited

U.S. PATENT DOCUMENTS

| | | |
|---|---|---|
| 6,388,279 B1 | 5/2002 | Sakai et al. |
| 2005/0105245 A1 | 5/2005 | Kuisma et al. |
| 2011/0247421 A1 | 10/2011 | Tokuda et al. |
| 2011/0309458 A1 | 12/2011 | Gamage et al. |
| 2012/0017693 A1 | 1/2012 | Robert et al. |
| 2013/0205908 A1* | 8/2013 | Hsu ........................ G01L 9/0047 73/725 |
| 2014/0332910 A1* | 11/2014 | Kuisma ................. B81B 7/0048 257/416 |
| 2014/0352445 A1* | 12/2014 | Kuisma ................. G01L 9/0072 73/717 |
| 2014/0352446 A1* | 12/2014 | Kuisma ..................... G01L 9/12 73/724 |
| 2015/0204744 A1* | 7/2015 | Kuisma ................. G01L 9/0072 73/718 |

FOREIGN PATENT DOCUMENTS

| | | |
|---|---|---|
| EP | 1 780 525 A1 | 5/2007 |
| WO | 93/12410 A1 | 6/1993 |

OTHER PUBLICATIONS

International Search Report application No. PCT/IB2014/061282 dated Sep. 10, 2014.
Finnish Search Report dated Mar. 3, 2014 corresponding to Finnish Patent Application No. 20135487.

* cited by examiner

*Primary Examiner* — Andre Allen
(74) *Attorney, Agent, or Firm* — Squire Patton Boggs (US) LLP (57) ABSTRACT

A microelectromechanical pressure sensor structure wherein the length of the diaphragm is at least three times the width of the diaphragm. The oblong diaphragm experiences a minimized difference between lateral bending of the wafer and of the diaphragm along the width of the diaphragm. In a perpendicular direction, the diaphragm is at least three times longer due to which it accurately aligns with the bending form of the wafer. Due to this, the total error caused by bending of the structure is significantly reduced and a more robust structure is achieved. At the same time, the longer diaphragm provides mode deflected area for detection and thus significantly improves sensitivity of the device.

19 Claims, 8 Drawing Sheets

MICROELECTROMECHANICAL PRESSURE SENSOR WITH ROBUST DIAPHRAGM

BACKGROUND

1. Field

The present invention relates to microelectromechanical devices and especially to an improved pressure sensor structure and a pressure sensor according to preambles of the independent claims.

2. Description of the Related Art

Pressure is a physical quantity that corresponds to the ratio of force acting on a surface to the area of the surface. A device that can be used as a gauge to measure the pressure is a pressure sensor.

Atmospheric pressure is the pressure exerted at the surface by a column of air in an atmosphere. The atmospheric pressure varies with altitude and weather patterns. The quantity obtained with a pressure sensor may exclude the ambient atmospheric pressure and in this case indicates overpressure. If atmospheric pressure is included, the result indicates absolute pressure.

Micro-Electro-Mechanical Systems, or MEMS can be defined as miniaturized mechanical and electro-mechanical systems where at least some elements have some sort of mechanical functionality. Since MEMS devices are created with the same tools used to create integrated circuits, micromachines and microelectronic elements can be fabricated on a piece of silicon to enable various types of devices.

Figure 1:
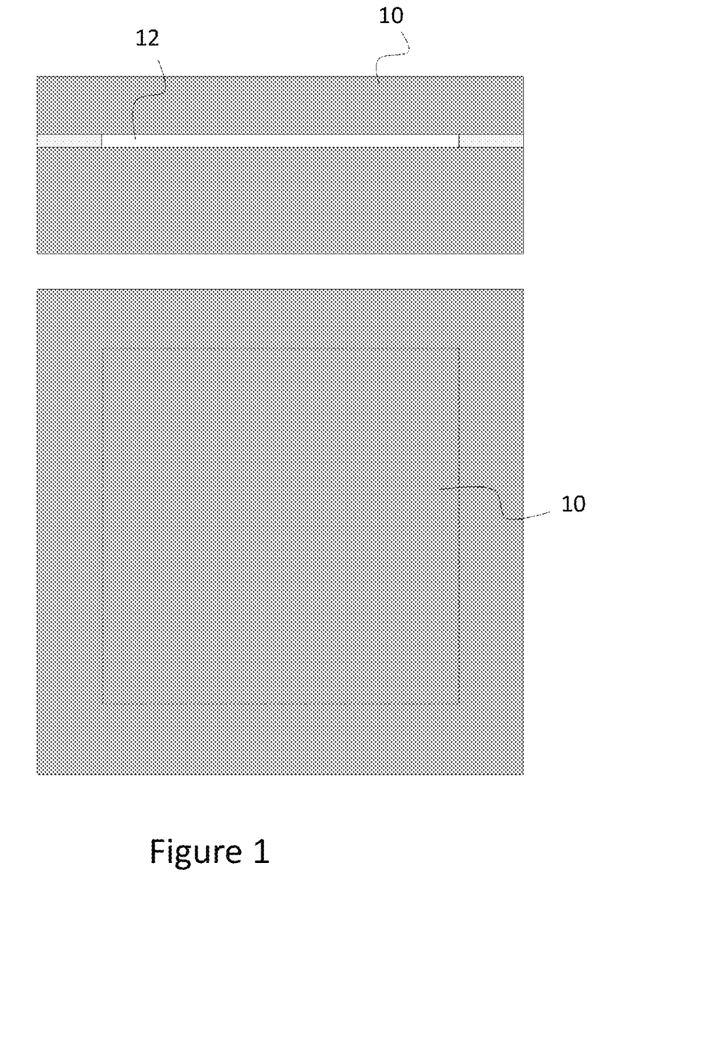
FIG. 1 illustrates an exemplary structure of a prior art rotationally symmetrical microelectromechanical pressure sensor structure.

FIG. 1 illustrates an exemplary structure of a microelectromechanical device for sensing of pressure. Microelectromechanical pressure sensors typically comprise a thin diaphragm 10 that is spanned over a gap 12 that provides a volume at a reference pressure. The diaphragm deforms due to difference between the reference pressure and an ambient pressure surrounding the sensor. The diaphragm displacement may be translated to an electrical signal with capacitive or piezoresistive sensing.

With microelectromechanical devices, the dimensions are very small; the components typically range in size from tens of micrometers to some millimeters. This imposes many challenges to the design. For example, in a microelectromechanical pressure sensor, the detected diaphragm displacement due to pressure change can be nanometers or less. This means that signals generated by the displacements are small. Already change of dimensions of the elements caused by thermal expansion in varying operating temperatures can cause significant variations to the measured values. In addition, the sensor structure and the associated electronics need to be capsulated in a package. The package may have different thermal expansion coefficient than the sensor structure, which may cause large, temperature dependent bending stresses that distort the measurements.

SUMMARY

The object of the present invention is to eliminate or at least alleviate these adverse effects and improve detection of the pressure-induced deflection of the diaphragm in microelectromechanical pressure sensors. The objective of the present invention is achieved with a pressure sensor structure and a pressure sensor according to the characterizing portions of the independent claims.

The preferred embodiments of the invention are disclosed in the dependent claims.

The claimed invention defines an oblong sensor structure, where the dimensions are proportioned such that the diaphragm can be considered to function almost one-dimensionally. Accordingly, the diaphragm is narrow to experience a minimized difference between bending of the wafer and of the diaphragm along the width of the diaphragm. In a perpendicular direction, the diaphragm is at least three times longer due to which it accurately aligns with the bending form of the wafer. Due to this specific dimensioning, the total error caused by bending of the structure is significantly reduced and at the same time a more robust structure is achieved. Furthermore, the longer diaphragm provides more deflected area for detection and thus significantly improves sensitivity of the device.

Features and advantages of the claimed invention and its embodiments are described in more detail with the detailed description of the embodiments.

BRIEF DESCRIPTION OF THE DRAWINGS

In the following the invention will be described in greater detail, in connection with preferred embodiments, with reference to the attached drawings, in which.

DETAILED DESCRIPTION

The following embodiments are exemplary. Although the specification may refer to "an", "one", or "some" embodiment(s), this does not necessarily mean that each such reference is to the same embodiment(s), or that the feature only applies to a single embodiment. Single features of different embodiments may be combined to provide further embodiments.

In the following, features of the invention will be described with a simple example of a device architecture in which various embodiments of the invention may be implemented. Only elements relevant for illustrating the embodiments are described in detail. Various implementations of pressure sensors comprise elements that are generally known to a person skilled in the art and may not be specifically described herein.

Figure 2:
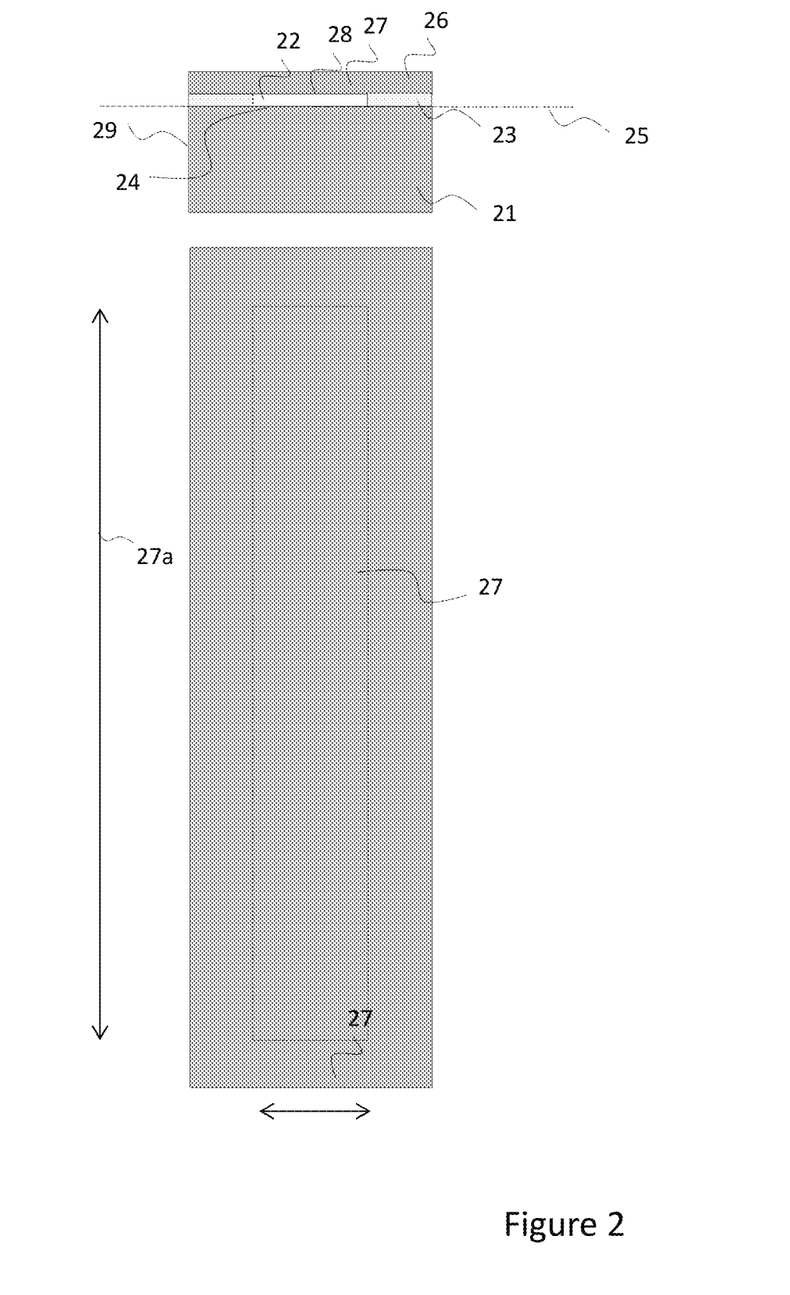
FIG. 2 illustrates a side view and a top view of an exemplary microelectromechanical pressure sensor structure.

As an embodiment of the present invention, FIG. 2 illustrates an exemplary structure of a microelectromechanical pressure sensor. FIG. 2 shows a side view and a top view of the illustrated sensor structure. The illustrated pressure sensor comprises a body structure formed by a planar base 21 and side walls 23. The planar base 21 may be manufactured from a wafer of silicon material, for example, but other conductor, semiconductor or insulator materials may be applied within the scope of protection. The planar base 21 has a first surface 24 that extends essentially along a first plane 25. The term essentially means here that the surface may accommodate minor surface structures (bumps or cavities), but over 90% of the surface area is, within tolerances, aligned to the first plane 25.

The side walls 23 extend away from the first surface 24, advantageously to a direction that is perpendicular to the first plane 25, as shown in FIG. 2. The side walls 23 are rigidly attached to the planar base 21 and thus circumscribe an open space onto it. Together with the planar base 21, the side walls 23 form a hollow, the depth of which corresponds with the height of the side walls 23. The side walls may be of electrically insulating material, like silicon dioxide, but other electrically insulating materials may be applied within the scope of protection. In the top view of the example structure, a cross section of the side walls shows as the rectangular perimeter that extends outwards from the dotted line. The dotted line denotes the inner surfaces of the side walls, and top edge of these inner surfaces defines a circumferential opening to the hollow formed by the planar base 21 and the side walls 23.

This hollow is hermetically sealed by a diaphragm plate 26 that extends on the side walls 23. The term diaphragm refers here to a film of elastically deforming material that is anchored at its periphery. The diaphragm plate 26 is a planar object that provides to the sensor structure a diaphragm 27 and anchors the diaphragm at its periphery. The diaphragm plate 26 may be made of silicon material, but other conductor, semiconductor or insulator materials may be applied within the scope of protection. The diaphragm plate 26 connects to the side walls 23 through a second surface 28 that is a plane initially parallel to the first surface 24 of the planar base 21. It is noted that the term initially relates here to the dimensions of the second surface to the manufacturing stages of the sensor. A person skilled in the art understands that during operation of the pressure sensor parts may deform out of their initial planar form.

The planar base 21, the side walls 23 and the diaphragm plate 26 are attached to each other such that the first surface 24, the second surface 28 and inner surfaces of the side walls 23 form a hermetically closed gap 22 that contains volatile material at a reference pressure. The gap 22 may be evacuated to contain only small amounts of residual gases, but it can also be filled with a selected gas or other volatile material at a selected reference pressure.

A part of the diaphragm plate 26 that extends over the circumferential opening to the gap 22 provides a diaphragm 27 whose periphery is defined by the opening, and anchoring is provided by a firm material contact between the top surface of the side walls and the diaphragm plate. The diaphragm 27 is exposed on one side to the reference pressure of the gap and on the other side to the ambient pressure on top of the diaphragm plate 26. This diaphragm 27 thus deforms in response to a pressure difference between the reference pressure and the ambient pressure. The extent of this deformation may be detected capacitively by translating with electrodes the deformation-induced change in the height of the gap 22 into an electric signal. The deformation may be detected alternatively with a piezoresistive or similar strain-gauge based method by translating deformation-induced stress in the diaphragm into an electrical signal with incorporated piezoresistors or strain-gauge resistors. All of these methods are disclosed in the art and as such well known to a person skilled in the art will not be discussed in more detail in this text. The solution is specifically applicable for pressure sensor structures where capacitive sensing is applied.

Conventionally, the shape of a pressure sensor diaphragm has been rotationally symmetric, either circular or square in form. The pressure sensor of FIG. 1 shows a diaphragm with such conventional rectangular shape. The reason for such a rotationally symmetric shape is that these diaphragms exhibit a maximum pressure sensitivity of the deflection for a given thickness of the diaphragm. In practice, variations in the thickness of the diaphragm are preferably limited to ±5% in order to achieve less than ±15% variation in the pressure sensitivity; the pressure sensitivity is inversely proportional to the third power of the thickness of the diaphragm. Accordingly, in conventional silicon pressure sensors, diaphragm thicknesses have varied in the range of 20 to 40 µm, side lengths or diameters of the diaphragms in the range of 0.5 to 1.0 mm, and the variations if the diaphragm thickness in the range of 1 to 2 µm.

With known advanced silicon thinning polishing technologies, the uniformity of a silicon wafer could nowadays be brought down to 0.3 µm level over the entire are of the wafer and from wafer to wafer. Considering the above preferences, appropriate uniformity could be achieved even with 5 µm thick diaphragms. This opens up a possibility to reduce also the area of the diaphragm and thereby the size of the whole sensor. This possibility is typically eagerly applied, not least due to reduced material costs. However, commercial pressure sensors are typically encapsulated with a measuring circuit and many times also other components into a package, and at some point, reduction of the area of the diaphragm no longer provides additional advantage to the design of the whole package. More important would be to apply any designed area of a microelectromechanical pressure sensor diaphragm as efficiently as possible.

It is understood that the area of the diaphragm correlates with the sensitivity of the pressure sensor. It has been detected, however, that by changing the ratio of the dimensions that define a specific diaphragm area in a specific manner, some important advantages can be achieved without compromising the sensitivity inherently derivable with that specific area. The advantages may achieved with an oblong diaphragm shape, where the aspect ratio of the longest dimension and the shortest dimension is at least three.

In view of FIG. 2, the side wall 23 attaches to the second surface on the diaphragm plate 26, and the top edge of the inner surfaces of the side walls 23 thus outlines the circumference of the diaphragm 27. This circumference has a length 27a and a width 27b in the second surface and thereby also in the direction of the first plane 25. The length 27a of the diaphragm corresponds to the longest extent of the diaphragm, and extends in a first direction parallel to the first plane 25. The width 27a of the diaphragm is then an extent of the diaphragm in a second direction. This second direction is also parallel to the first plane 25, but it is perpendicular to the first direction, as shown in FIG. 2.

The aspect ratio for an oblong shape that provides for the desired effects is achieved already when the length of the diaphragm is at least three times the width of the diaphragm. However, as will be discussed later, even higher aspect ratios from four to ten may be applied for improved performance. Presently a practical optimum value for diaphragm areas in microelectromechanical pressure sensors is in the order of 0.3 to 0.5 square millimeters. Accordingly, with a 5 μm thick diaphragm, the shorter dimension can be advantageously brought down to 0.25 mm whereas the longer dimension may, correspondingly, range from 0.75 mm or 1 mm to 1.5 mm or even 2 mm. It is noted, however, that the scope is not limited to any specific area limit. The scope is neither restricted to the rectangular shaped diaphragm of FIG. 2, any oblong shape fulfilling the above aspect ratio definition may be applied within the scope of protection.

Figure 3:
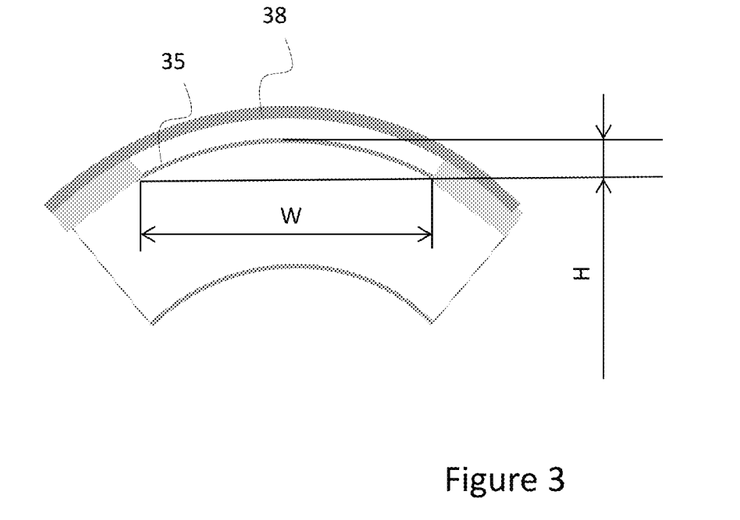
FIG. 3 illustrates a curved shape of a bent sensor structure.

One advantage of the invention is increased robustness against packaging induced bending of the sensor structure. As known in the art, different thermal expansion coefficients of material layers tend to result in bending stresses. In a packaged device, a mismatch between thermal expansion coefficients of the sensor and the package may bend the sensor structure to a curved shape, as shown in FIG. 3. This curved shape may be approximated with a spherical cap, where the width of the base of the cap is W and the height of the cap is H. When H>>W, which is the case with diaphragms of microelectromechanical sensors, the height of the cap can be approximated to be proportional to the second power of the width $H\sim W^{2\prime}$ when the radius of the curvature of the base is kept constant.

Figure 4:
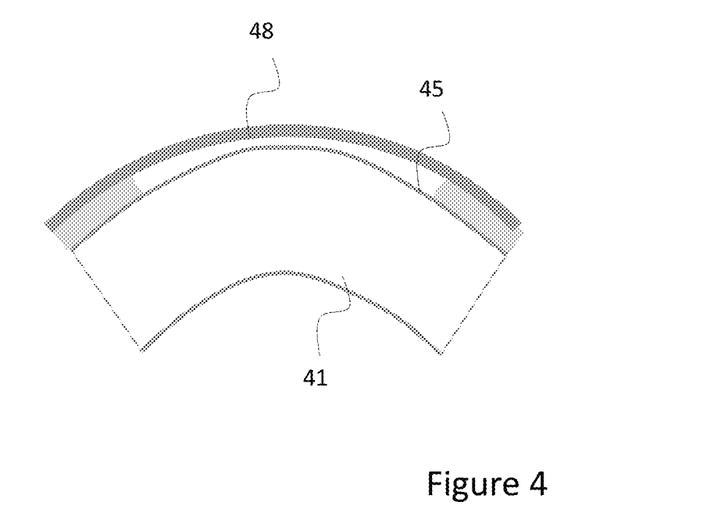
FIG. 4 illustrates differently curved surfaces in a bent sensor structure.

In capacitive detection, the diaphragm deflection is sensed by detecting changes in capacitance over the gap between a deflecting diaphragm electrode on the first surface 35 and a fixed electrode on the second surface 38. Ideally, the detected capacitance would change only due to the deflection in response to detected pressure changes. Even bending of the diaphragm and the fixed electrode by external forces can be tolerated; this would ideally not disturb the detection, if the first surface 35 in the bottom of the gap and the second surface 38 in the top of the gap would bend similarly, i.e. such that the height of the gap would not change because of the bending. However, there are several practical factors that cause the surfaces to deform differently, as shown in FIG. 4.

For example, a wafer of the planar base 41 may bend to a spherical surface if it is subject to uniform bending moment, and if its lateral dimension is very large compared to its thickness. The latter requirement is not easily fulfilled due to limited size of the sensor compared to its thickness. This means that the bending moment tends to be relaxed close to the edges of the wafer by shear deformation. Because of this, the wafer thus tends to bend into a shape that in not spherical but more like an obtuse conical form, shown in FIG. 4. On the other hand, because of different dimensioning, the diaphragm typically tends to bend into a parabolic shape. The result is that the distance between the first surface 45 and the second surface 48 will change not only because of the deflection, but also because of the bending. This will cause an error to the measured capacitance values. It is noted that this edge effect is not the only factor; there are also other mechanisms that potentially contribute to error through different bending of the structures.

With rotationally symmetrical bending elements, the width and the length of the element are equal and bending can be considered to take place similarly in both of these directions. As discussed above with FIG. 3, the height of the spherical cap of the second surface 38 is approximately proportional to the second power of the width/length of a symmetrical element. With an oblong element, this same is true, but now the bending in the width and in the length directions are not the same. Due to the proportionality to the second power of the width, the bending will increase strongly in the direction of the length of the oblong element, and decrease rapidly in the direction of the width of the oblong element. For example, in the direction of the width, a 0.25 mm wide oblong element will bend about nine times less than a 0.75 mm wide square element.

Figure 5A:
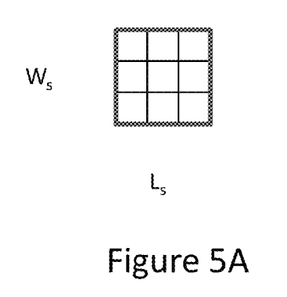
FIG. 5A illustrates form of a conventional square diaphragm.
Figure 5B:
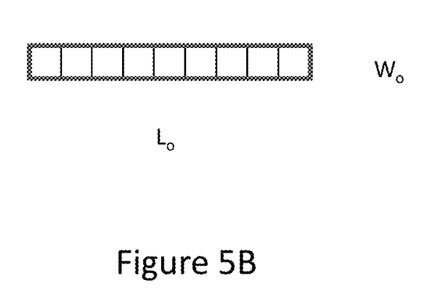
FIG. 5B illustrates form of a claimed oblong diaphragm.

The claimed oblong shape of the diaphragm applies this understanding to alleviate the effect of bending to the detection. FIG. 5A illustrates a conventional square diaphragm 50. The width $W_s$ of the square diaphragm is equal to the length $L_s$ of the square diaphragm. FIG. 5B illustrates a claimed oblong diaphragm 51, where the width $W_o$ of the oblong diaphragm is at least three times the length of the oblong diaphragm $L_o$. As an example, let us assume here that $L_o=3*W_o$. The oblong diaphragm 51 has the same effective area A as the square diaphragm $A=W_s^2=L_s^2=W_o*L_o$. With the oblong shape, it is understood that in the direction of the length $L_o$, the oblong diaphragm bends much more (about nine times) than the square diaphragm. On the other hand, in the direction of the width $W_o$ the oblong diaphragm bends much less (about nine times) than the square diaphragm. It has been detected, however, that the error caused to the measured capacitance value is dominated by the bending in the shorter dimension (width) and it is insensitive to the bending in the longer dimension (length) and therefore the error experienced with the oblong shaped area is significantly less than with the square shaped area.

Figure 6:
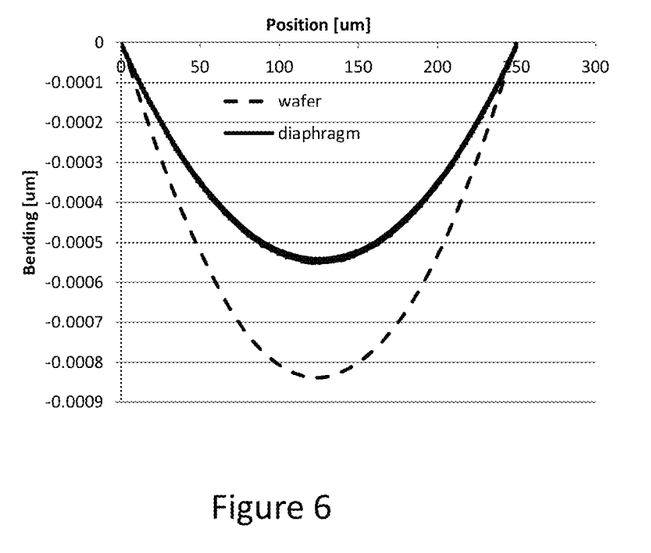
FIG. 6 illustrates bending of the first surface of the wafer and the second surface of the diaphragm over the width of the diaphragm.

The dimensions of microelectromechanical pressure sensors are always optimized, and with an oblong diaphragm, also the wafer of the planar base typically is of oblong shape. FIG. 6 shows a finite element (FEM) simulation of bending of the first surface of the wafer and the second surface of the diaphragm over the width of the diaphragm. The simulations model an oblong sensor with a 0.25 mm wide and 1.6 mm long diaphragm. The results of FIG. 6 show that with the claimed oblong dimensioning, in the direction of the width of the diaphragm, the wafer tends to bend much more than the diaphragm. However, due to the short width of the diaphragm, the absolute values of bending are very small. In a square diaphragm the width should be about 0.64 mm to provide the same effective area as the modeled oblong diaphragm. It is easily understood that this length would already result to over six times stronger bending of the diaphragm.

Figure 7:
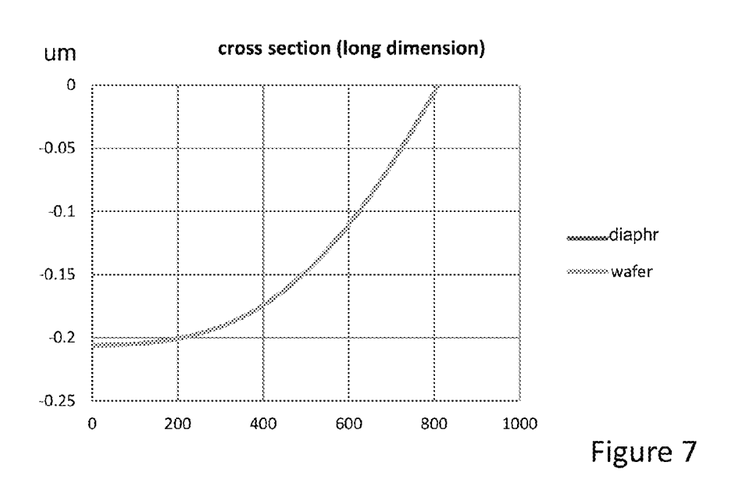
FIG. 7 illustrates bending of the first surface of the wafer and the second surface of the diaphragm over half of the length of the diaphragm.

Corresponding to FIG. 6, FIG. 7 shows a finite element (FEM) simulation of bending of the first surface of the wafer and the second surface of the diaphragm over half of the length of the diaphragm. It is seen that the absolute values of the bending are much bigger than in FIG. 6. However, it is also seen that even if the wafer now bends strongly, the shape of bending of the diaphragm very precisely follows the shape of bending of the wafer (in the shown results the curves actually coincide). This means that the distance of the gap in this direction does not effectively change because of bending of the wafer, and no additional error is caused to the measured capacitance values.

In simple terms, in the claimed oblong sensor structure, the width of the diaphragm is made short enough to experience a much smaller difference between bending of the wafer and of the diaphragm than in a corresponding symmetric structure. On the other hand, the length of the diaphragm is made long enough to be accurately aligned with the bending of the wafer. Due to this, in view of the error, the effect of bending of the wafer along the width of the diaphragm dominates and the total error is thus significantly smaller than with a corresponding rotationally symmetric structure.

Figure 8:
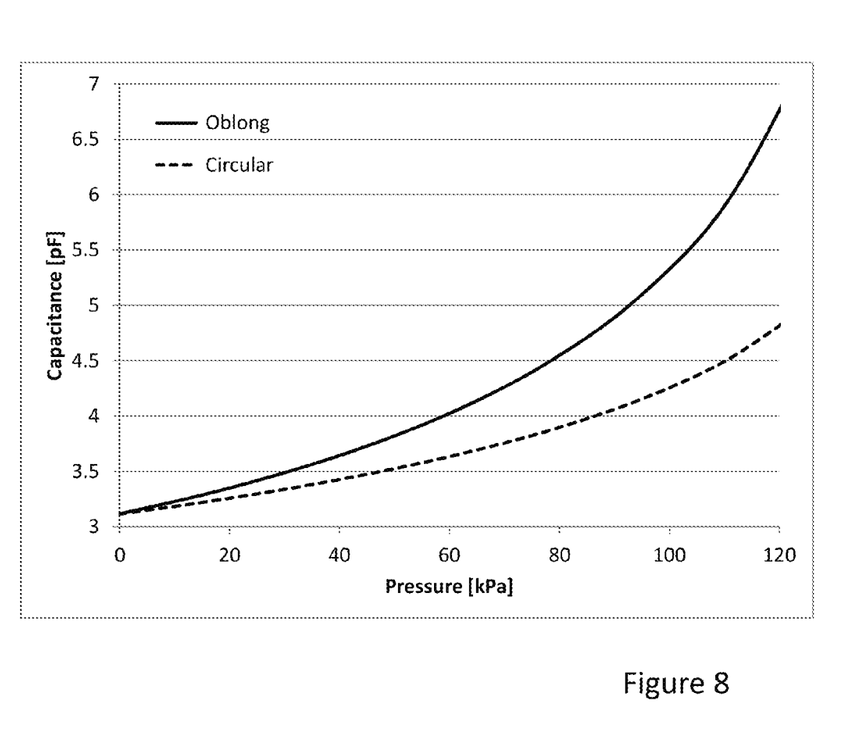
FIG. 8 illustrates capacitance values as a function of detected pressure.
Figure 9:
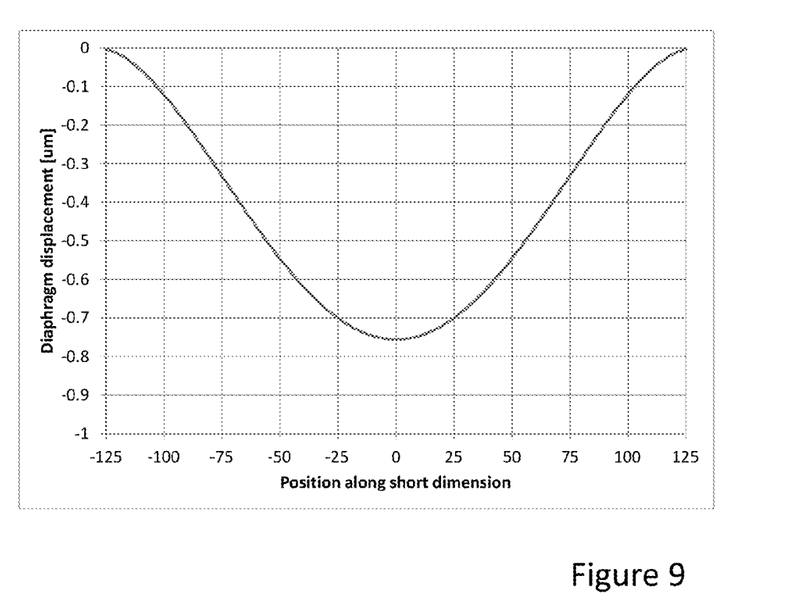
FIG. 9 shows displacement of a diaphragm as a function of a position in the width dimension of the diaphragm.
Figure 10:
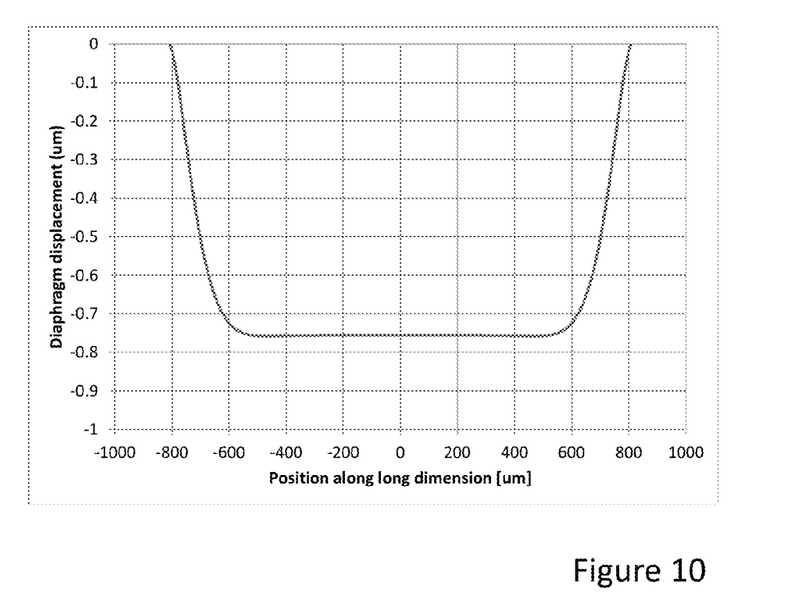
FIG. 10 shows displacement of the diaphragm as a function of a position in the width dimension of the diaphragm.

Another advantage of the invention is improved sensitivity. This is illustrated in FIG. 8 that shows FEM simulated capacitance values as a function of detected pressure in the exemplary configuration of FIGS. 6 and 7. The continuous line represents capacitance values generated with said oblong diaphragm structure and the dashed line represents capacitance values generated with a circular diaphragm structure of the same effective area. It is easily seen that the difference in the results is remarkable. The reason for the improvement is that the deflection is detected from the whole diaphragm. With a rotationally symmetric structure, the deflected part of the diaphragm forms a surface that is a point-like dint in the center of the diaphragm. With the oblong structure, the deflected part of the diaphragm forms a surface that extends along the length direction, like a linear groove. This is illustrated by means of FIGS. 9 and 10. FIG. 9 shows displacement of the modeled diaphragm as a function of a position in the width dimension of the diaphragm. FIG. 10 shows displacement of the modeled diaphragm as a function of a position in the length dimension of the diaphragm. It is seen that the maximum deflection in FIG. 10 extends to a longer distance, and therefore induces higher capacity and enables much higher signal for detection. In a square or circular structure with the same effective area, the displacement in both directions is by far like the displacement of FIG. 9, and therefore provides lower signal level, as shown in FIG. 8.

A further advantage of the invention is a better match of dimensions in electronic packaging. Very often the pressure sensor will be assembled into a package side by side with an integrated circuit. A typical interface circuit will have lateral dimensions 2 mm×2 mm. It is easily understood that a 0.5 mm×2 mm sensor may save 0.5 mm in one dimension of the package compared to a 1 mm×1 mm square sensor. This is significant since the state of the art pressure sensors are 3×3 $mm^2$ in size and the next target is to get to 2×2 $mm^2$ level.

In a capacitive sensor the distance between the deflecting diaphragm and the wafer that carries or acts as the stationary electrode is typically very small, often in the order of 1 μm or even less. This narrow distance and the diaphragm area form a sealed reference pressure gap that may contain rarified gas or gas at a selected reference pressure. As discussed earlier, the difference between the ambient pressure (applied pressure) and the reference pressure of the gas in the gap will cause the diaphragm to bend. All changes in the reference pressure after an initial calibration procedure will show as a pressure measurement error.

If the volume of the sealed gap is very small, adsorption, absorption and desorption of gases on the sensor materials will influence the long term stability of the sensor. It has been noticed that high temperature manufacturing steps during or after the sealing of the gap will cause gases to desorb from the surface and from the bulk of the sensor materials. The desorbed gas will gradually adsorb back on the surfaces and absorb into the sensor materials. This process will continuously change the reference pressure within the gap. The process may take years with only a weak slowing down of the process occurring when all the gas has been consumed, or when the receiving molecular sites have been saturated near the surface. A typical gas that behaves in this manner is water vapor.

To improve the stability limited by the reference pressure change it is desirable to increase the volume of the gap. In reference to FIG. 2, let us assume that the height of the gap 22 is 1 μm. A change in the number of water molecules that corresponds to 1/1000 of a monomolecular layer on the surfaces of the gap may cause a 100 Pa change to the reference pressure in such a gap. A change of this magnitude already corresponds to the maximum allowed drift of a barometric pressure sensor in one year's time in non-demanding consumer applications, like sports watches and smart phones.

Figure 11:
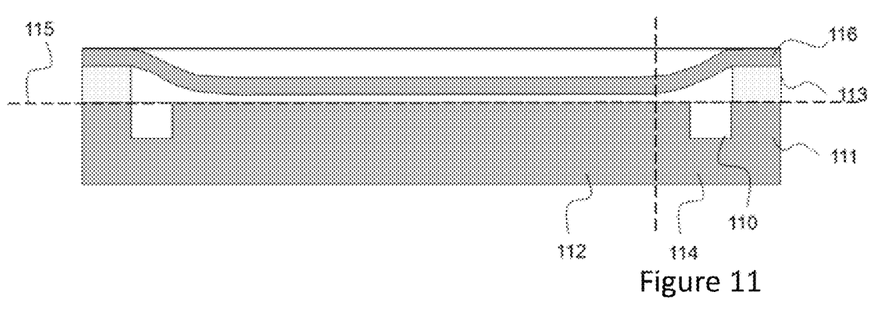
FIG. 11 is a side view that shows an oblong sensor structure along its length.

FIG. 11 illustrates an embodiment where the oblong sensor is applied to provide a gap with larger volume without compromising the sensitivity or the mechanical robustness of the pressure sensor. FIG. 11 is a side view that shows the sensor structure along its length, and shows the planar base 111, the side walls 113 and the diaphragm plate 116 elements described in more detail above with FIG. 2. The added volume is created by means of one or more cavities 110 that extend from the first surface of the planar base 111 into the planar base. The one or more cavities 110 may be manufactured to the wafer of the planar base 111 by removing planar base material e.g. by etching. The extent of the one or more cavities 110 through the thickness of the wafer is optimized to retain the mechanical ruggedness and to control manufacturing costs. For example, in a 150 μm thick or thicker wafer a cavity is preferably in the order of 100 μm deep.

An area of the first surface 115 that is within the gap is considered as a gap area 112. An area of the first surface where the cavities may be positioned is considered as a cavity area 114. As shown in FIG. 11, the one or more cavities 110 are preferably manufactured into positions where the deflection of the overlying diaphragm is smaller than its maximum deflection. Let us denote that a position in the cavity area corresponds with a position in the second surface of the diaphragm when a line connecting these two positions is perpendicular to the plane of the first surface. As shown in FIG. 11, during operation, the diaphragm deflects such that a point in a position in the second surface moves towards the first plane, i.e. in a direction perpendicular to the first plane 115. At one or more positions, the deflection is greater than at any other positions so that the deflection of the diaphragm reaches its maximum at that those one or more positions. In the case illustrated in FIGS. 8 and 9 the maximum deflection occurs at the mid-point in the width dimension and at +/−500 μm positions along the length dimension.

It is understood that capacitive sensitivity is lost at the cavity area since the effective dielectric spacing is the sum of the height of the gap and the depth of the cavity. The gap is typically very thin compared to the wafer so the depth of the cavity may be even 100 times larger than the height of the gap. This means that the capacitive sensitivity on the cavity area 114 may be smaller by a factor of 10 000 than on other areas of the gap area 112. It is thus advantageous to position the one or more cavities in the cavity area 114 where the diaphragm deflection is less than said maximum deflection value.

Advantageously, the one or more cavities are outside an area 112 of the first surface where the diaphragm may during operation reach its maximum deflection. Preferably the one or more cavities exist in an area 114 where deflection of the diaphragm in a corresponding position is less than two thirds of the maximum deflection.

In rotationally symmetric pressure sensor configurations, such cavity areas cannot be introduced without essentially compromising sensitivity or mechanical robustness of the sensor. However, as shown in FIG. 11, in oblong pressure sensors the cavity area 112 over which the diaphragm can extend to its maximum is longer, so the one or more cavities can be safely positioned to an area 114 in the end or in opposite ends of the longest extent of the diaphragm. This will have no effect on how the planar base 111 and the diaphragm 116 may bend due to external mechanical stresses outside the cavity area 114. The gap volume is increased, and stability of the sensor is thereby significantly increased, without causing essential negative side effects to the measurements. In tests with typical microelectromechanical device dimensions, total gap volume increases in the range of 20 to 30 have been achieved with these simple cavity structures.

On order to be positioned to limited areas along or right beside the side walls in the first surface, the one or more cavities may form a string. Preferably at least one string is formed of an elongate cavity. The term elongate means here that the length of the cavity is at least two times the mean width of the cavity. The form of the string follows the form of the sensor structure, so with a rectangular sensor structure, the elongate cavity may be a line cavity. With an oval sensor structure, the elongate cavity may be in the form of an arc, correspondingly. FIG. 11 illustrates an advantageous configuration where the pressure sensor comprises two linear cavities, each of which extends in an opposite end of the longest extent of the diaphragm.

Figure 12:
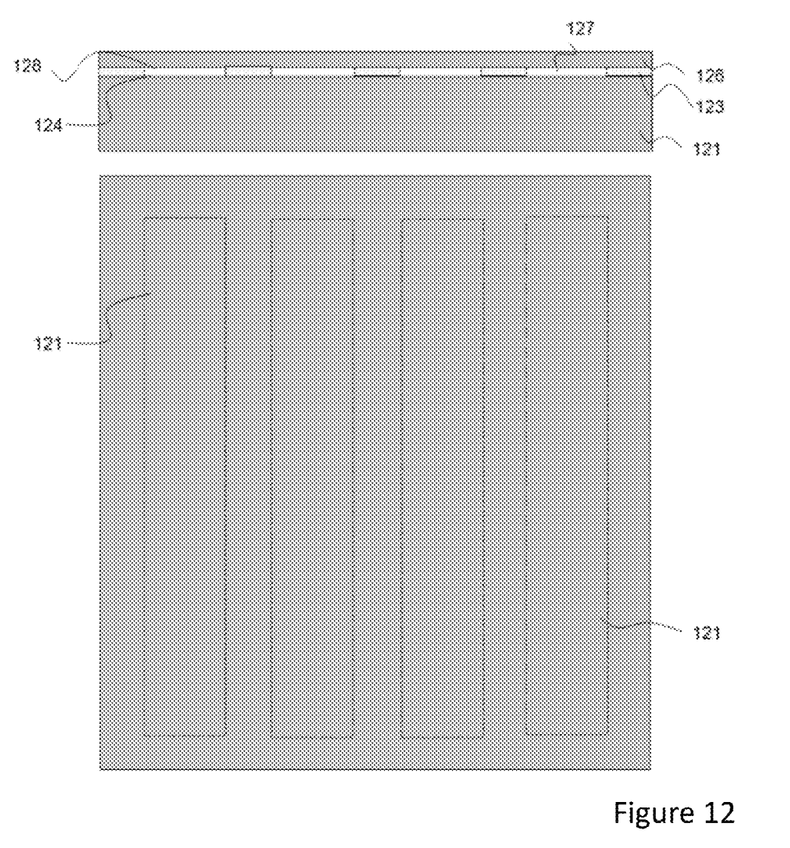
FIG. 12 illustrates a further embodiment where the sensor structure is configured to include a plurality of sensing diaphragms.

FIG. 12 illustrates a further embodiment where the sensor structure is configured to provide a plurality of sensing diaphragms. FIG. 12 is a side view that shows the planar base 121, the side walls 123, the diaphragm plate 126 elements and the first and second surfaces 125, 128 described in more detail above with FIG. 2. In the embodiment, the planar base 121, the side walls 123 and the diaphragm plate 126 are attached to each other such that the first surface, the second surface and inner surfaces of the side walls form two or more separate hermetically closed gaps with separate gap areas. Top edges of inner surfaces of the side walls form in the second surface circumferences of two or more diaphragms 127 that have a length and a width in the direction of the second surface. The length of these diaphragms is in a direction of the longest extent of the diaphragm, and their width is in a direction perpendicular the direction of the length in the second surface. As earlier, the length of each of the diaphragms is at least three times the width of the diaphragm. In this way the advantages of the oblong diaphragm can be achieved while retaining a more traditional aspect ratio of a sensor die. This may be advantageous in some packaging configurations or with an extreme aspect ratio of the diaphragm.

As discussed above, the bending moment tends to be relaxed close to the edges of the wafer by shear deformation. Because of this, the wafer tends to bend into a shape that in not spherical but more likes an obtuse conical form. A further effect that makes the bending of the elements to deviate from ideal is the bending moments that are generated at the edges of the diaphragm due to asymmetric support by the insulator when any tensile or compressive in-plane stress is present at the mid-plane of the diaphragm. Conventional approach to bending related problems would be to increase stiffness of the elements. A further embodiment of the invention is, however, based on a new understanding that with a specific dimensioning of the sensor structure, a negative effect from increased bending can be compensated by a positive effect from improved alignment between the two bending surfaces.

Referring back to the side view of FIG. 2, the sensor structure has a thickness in a direction perpendicular to the first surface 24. Outer surface 29 of the sensor structure extends at least partly along the direction perpendicular to the first surface of the sensor structure. It is noted that in FIG. 2 outer surfaces of the body structure and the diaphragm plate are aligned, and the outer surface 29 of the sensor structure extends completely along the direction perpendicular to the first surface. However, also structures where a part of the outer surface of the sensor structure extends in another direction (e.g. horizontally) are included. The width of the side walls represents the distance from the outer surface of the sensor structure to a point of support where anchoring of the diaphragm ends. The width of the side walls may be determined from a shortest distance from the top edge of the inner surfaces of the side walls to the outer surface 29 of the sensor structure.

It has been detected that said positive effect exceeds the negative effect with a specific dimensioning, where the thickness of the sensor structure is less than two times the width of the side walls. The sensor structure may bend somewhat more than conventional sensor structures, but bending of the diaphragm and bending of the planar base are well aligned, and the effect of the bending is thereby minimized. This dimensioning is advantageous in sensor structures with the claimed oblong form. However, the advantage of this dimensioning is not dependent on the oblong shape, the same dimensioning may be applied with other sensor structure shapes, like rotationally symmetric sensor structure shapes.

Figure 13:
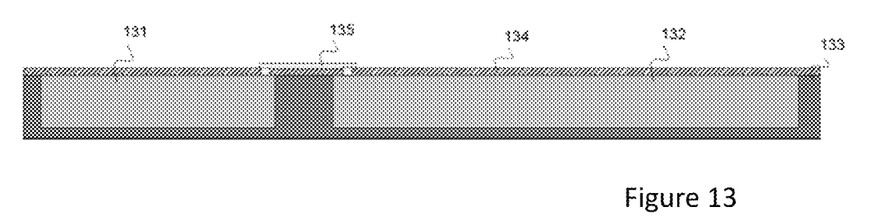
FIG. 13 illustrates an embodiment of a microelectromechanical pressure sensor.

FIG. 13 illustrates an embodiment of a microelectromechanical pressure sensor 130. The pressure sensor comprises a sensor structure 131 which may be any of the alternative sensor structures described above. The pressure sensor also comprises an electrical circuit part 132. The sensor structure 131 and the electrical circuit part 132 may be separate dies molded in plastic material 133. A polymer dielectric layer 134 may be deposited in the re-built wafer. Contacts to the electrical terminals 135 of the dies may be provided with deposited film layers through openings on the dielectric layer 134.

It is apparent to a person skilled in the art that as technology advances, the basic idea of the invention can be implemented in various ways. The invention and its embodiments are therefore not restricted to the above examples, but they may vary within the scope of the claims.

The invention claimed is:

1. A microelectromechanical pressure sensor structure that comprises a body structure and a diaphragm plate, wherein the body structure comprises a planar base and side walls;
a first surface extends along the planar base;
the side walls extend as a circumference away from the planar base;
the diaphragm plate extends on the side walls along a second surface;
the planar base, the side walls and the diaphragm plate are attached to each other such that the first surface, the second surface and inner surfaces of the side walls form a hermetically closed gap in a reference pressure;
a top edge of the inner surfaces of the side walls forms a circumference of a diaphragm that has a length and a width in the direction of the second surface, wherein the length is in a direction of the longest extent of the diaphragm, and the width is in a direction perpendicular the direction of the length in the direction of the second surface; and
the length of the diaphragm is at least three times the width of the diaphragm.

2. A pressure sensor structure of claim 1, wherein the side walls extend circumferentially away from the planar base to a direction perpendicular to the first surface.

3. A pressure sensor structure of claim 1, wherein at operation the diaphragm is configured to deflect such that a point in a position in the second surface is moved towards the first surface in a direction perpendicular to the first surface.

4. A pressure sensor structure of claim 1, wherein the length of the diaphragm is at least five times the width of the diaphragm.

5. A pressure sensor structure of claim 1, wherein one or more cavities that extend from the first surface into the planar base.

6. A pressure sensor structure of claim 5, wherein the one or more cavities form a string.

7. A pressure sensor structure of claim 6, wherein the string is parallel to at least a part of an inner surface of the side walls.

8. A pressure sensor structure of claim 6, wherein the string comprises at least one elongate cavity, the length of the cavity being at least two times the mean width of the cavity.

9. A pressure sensor structure of claim 8, wherein the elongate cavity is linear, forming a line cavity.

10. A pressure sensor structure of claim 9, wherein part of the circumference of the cavity is aligned with at least a part of an inner surface of the side walls.

11. A pressure sensor structure of claim 7, wherein the string extends in an end of the longest extent of the diaphragm.

12. A pressure sensor structure of claim 9, wherein the pressure sensor comprises two line cavities, each of which extends in an opposite end of the longest extent of the diaphragm.

13. A pressure sensor structure of claim 5, wherein
the string exists in one or more cavity areas on the first surface;
a position in the cavity area corresponds with a position in the second surface when a line connecting the positions is perpendicular to the plane of the first surface;
the diaphragm is configured to have a maximum deflection that corresponds to a largest allowed displacement of the diaphragm at operation;
cavity areas exist in positions where deflection of the diaphragm in a corresponding position is less than the maximum deflection.

14. A pressure sensor structure of claim 13, wherein cavity areas exist in positions where deflection of the diaphragm in a corresponding position is less than two thirds of the maximum deflection.

15. A pressure sensor structure of claim 1, wherein
the planar base, the side walls and the diaphragm plate are attached to each other such that the first surface, the second surface and inner surfaces of the side walls form two or more hermetically closed gaps;
top edges of inner surfaces of the side walls form in the second surface circumferences of two or more diaphragms that have a length and a width in the direction of the second surface, wherein the length of a diaphragm is in a direction of the longest extent of the diaphragm, and the width is in a direction perpendicular the direction of the length in the second surface;
the length of each of the diaphragms is at least three times the width of the diaphragm.

16. A pressure sensor structure of claim 1, wherein the pressure sensor structure comprises a fixed electrode on the first surface and a diaphragm electrode on the second surface for detecting changes in capacitance over the gap.

17. A pressure sensor structure of claim 1, wherein the planar base and/or the diaphragm are made of electrically conducting material and provide a capacitor structure for detecting changes in capacitance over the gap.

18. A pressure sensor structure of claim 1, wherein:
the sensor structure has a thickness in a direction perpendicular to the first surface;
outer surface of the sensor structure extends along the direction perpendicular to the first surface of the sensor structure;
width of the side walls corresponds to a shortest distance from the top edge of the inner surfaces of the side walls to the outer surface of the sensor structure;
the thickness of the sensor structure is less than two times the width of the side walls.

19. A pressure sensor, comprising:
a microelectromechanical pressure sensor structure that comprises a body structure and a diaphragm plate, wherein
the body structure comprises a planar base and side wall;
a first surface extends along the planar base;
the side walls extend as a circumference away from the planar base;
the diaphragm plate extends on the side walls along a second surface;
the planar base, the side walls and the diaphragm plate are attached to each other such that the first surface, the second surface and inner surfaces of the side walls form a hermetically closed gap in a reference pressure;
a top edge of the inner surfaces of the side walls forms a circumference of a diaphragm that has a length and a width in the direction of the second surface, wherein the length is in a direction of the longest extent of the diaphragm, and the width is in a direction perpendicular the direction of the length in the direction of the first plane; and
the length of the diaphragm is at least three times the width of the diaphragm.

\* \* \* \* \*